US007510818B2

(12) United States Patent
Chen et al.

(10) Patent No.: US 7,510,818 B2
(45) Date of Patent: *Mar. 31, 2009

(54) REVERSIBLE PHOTOBLEACHABLE MATERIALS BASED ON NANO-SIZED SEMICONDUCTOR PARTICLES AND THEIR OPTICAL APPLICATIONS

(75) Inventors: Zhiyun Chen, Alexandria, VA (US); Erin F. Fleet, Springfield, VA (US); Serpil Gönen, College Park, MD (US); Gregory D. Cooper, Vienna, VA (US)

(73) Assignee: Pixelligent Technologies LLC, College Park, MD (US)

( * ) Notice: Subject to any disclaimer, the term of this patent is extended or adjusted under 35 U.S.C. 154(b) by 535 days.

This patent is subject to a terminal disclaimer.

(21) Appl. No.: 10/730,382

(22) Filed: Dec. 9, 2003

(65) Prior Publication Data

US 2004/0152011 A1 Aug. 5, 2004

Related U.S. Application Data

(60) Provisional application No. 60/431,735, filed on Dec. 9, 2002.

(51) Int. Cl.
*G03C 5/56* (2006.01)
(52) U.S. Cl. .................................. 430/320; 430/945
(58) Field of Classification Search .................. None
See application file for complete search history.

(56) References Cited

U.S. PATENT DOCUMENTS

| 4,253,728 | A |   | 3/1981  | Venkatesan et al. |         |
|-----------|---|---|---------|-------------------|---------|
| 4,904,569 | A | * | 2/1990  | Fukuda et al.     | 430/311 |
| 5,187,715 | A |   | 2/1993  | Weisbuch et al.   |         |
| 5,281,840 | A |   | 1/1994  | Sarma             |         |
| 5,847,812 | A |   | 12/1998 | Ooki et al.       |         |
| 5,851,707 | A |   | 12/1998 | Shibuya et al.    |         |
| 5,902,716 | A |   | 5/1999  | Owa et al.        |         |
| 6,005,707 | A |   | 12/1999 | Berggren et al.   |         |
| 6,291,110 | B1 |  | 9/2001  | Cooper            |         |
| 6,291,145 | B1 |  | 9/2001  | Kokubo et al.     |         |
| 6,339,582 | B1 | * | 1/2002 | Ichihara et al.   | 369/275.2 |
| 6,440,637 | B1 |  | 8/2002  | Choi et al.       |         |
| 6,661,745 | B1 | * | 12/2003 | Tominaga et al.  | 369/13.33 |
| 6,721,040 | B2 | * | 4/2004 | Saito et al.      | 355/69  |

(Continued)

FOREIGN PATENT DOCUMENTS

EP 580346 * 1/1994

(Continued)

OTHER PUBLICATIONS

L.G. Zimin, et al., "*Room-temperature Optical Nonlinearity in Semiconductor-doped Glasses*", Phys. Stat. Sol. (b) 150:653-6 (1988).

(Continued)

*Primary Examiner*—Martin J Angebranndt
(74) *Attorney, Agent, or Firm*—Nixon & Vanderhye P.C.

(57) ABSTRACT

Semiconductor nano-particles, due to their specific physical properties, can be used as reversible photo-bleachable materials for a wide spectrum, from far infrared to deep UV. Applications include, reversible contrast enhancement layer (R-CEL) in optical lithography, lithography mask inspection and writing and optical storage technologies.

72 Claims, 7 Drawing Sheets

U.S. PATENT DOCUMENTS

| | | | |
|---|---|---|---|
| 6,826,144 | B1 | 11/2004 | Ichihara et al. |
| 6,927,002 | B2 | 8/2005 | Hattori et al. |
| 7,081,328 | B2 * | 7/2006 | Todori et al. ............ 430/270.11 |
| 2002/0027647 | A1 | 3/2002 | Cooper et al. |
| 2002/0182541 | A1 | 12/2002 | Gonsalves |
| 2003/0081300 | A1 * | 5/2003 | Spoonhower et al. ....... 359/200 |
| 2003/0117598 | A1 | 6/2003 | Case et al. |
| 2003/0129545 | A1 | 7/2003 | Kik et al. |
| 2004/0152011 | A1 | 8/2004 | Chen et al. |

FOREIGN PATENT DOCUMENTS

| | | | |
|---|---|---|---|
| JP | 06-044609 | * | 2/1994 |
| JP | 11-250501 | * | 9/1999 |
| JP | 2001-057329 | * | 2/2001 |
| WO | 99/21934 | * | 5/1999 |
| WO | WO 03/009058 A2 | | 1/2003 |

OTHER PUBLICATIONS

Al.L Efros, et al., "Interband absorption of light in a semiconductor sphere," Sov. Phys. Semicon., 16:772-78 (Jul. 1982).

L.E. Brus, J. Chem. Phys., 79(11), "A simple model for the ionization potential,electron affinity, and aqueous redox potentials of small semiconductor crystallites," 5566-71 (Dec. 1, 1983).

A. Kornowski, et al., "*Preparation and Photophysics of Strongly Luminescing $Cd_3P_2$ Quantum Dots*", J. Phys. Chem, 1996, 100: 12467-71.

C.B. Murray, et al., "*Sythesis and Characterization of Monodisperse Nanocrystals and Closed-Packed Nanocyrstal Assemblies,*" Annu. Rev. Mater. Sci., 30:545-610 (2000).

H. Kageshima, et al., "InGaAs/GaAs photorefractive multiple quantum well device in quantum confined Stark geometry." Appl. Phys. B 72, 685-689(2001).

P. Gribkovskii, V.A. Zyulkov, A.E. Kazachenko, and S.A. Tikhomirov, "*OpticalNnonlinearity of Semiconductor Microcrystal $CdS_xSe_{1-x}$ Under the Action of Picosecond and Nanosecond Llaser Pulses*", 1988, Phys. Stat. Sol. (b) 158: 359-66.

A. Sclafani, et al., "Effect of silver deposits on the photocatalytic activity of titanium dioxide samples for the dehydrogenation or oxidation of 2-propanol," J. Photochem. Photobiol. A: Chem. 1991, 59, 181.

S.A. Empedocles, et al., "Quantum-Confined Stark Effect in Single CdSe Nanocrystallite Quantum Dots," Science, 278, 2114 (Dec. 19, 1997).

Nagase, et al., "Super-Resolution Effect of Semiconductor-Doped Glass," Jpn. J. Appl. Phys. vol. 38 (1999), pp. 1665-1668, Part 1, No. 3B (Mar. 1999).

Noharet, Bertrand, "Harnessing light with semiconductor Spatial Light Modulators," Aperturen-Surfaces and Imaging, vol. 1-2001, pp. 12-13, XP002363385 (2001).

Nomura, S. et al., "*Clearly resolved exciton peaks in $CdS_xSe_{1-x}$ microcrystallites by modulation spectroscopy*", Sol. Stat. Comm., 73: 425-9 (1990).

Ooki, Hiroshi et al., "Experimental study on non-linear multiple exposure method," SPIE vol. 3051, pp. 85-93, Santa Clara, California (Mar. 12-14, 1997).

Shibuya, Masato et al., "Performance of Resolution Enhancement Technique Using Both Multiple Exposure and Nonlinear Resist," Jpn. J. Appl. Phys. vol. 33 (1994), pp. 6874-6877, Part 1, No. 12B (Dec. 1994).

* cited by examiner

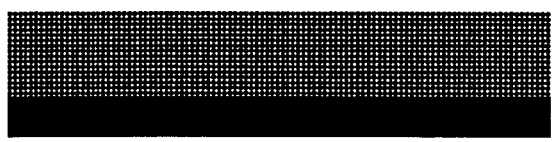
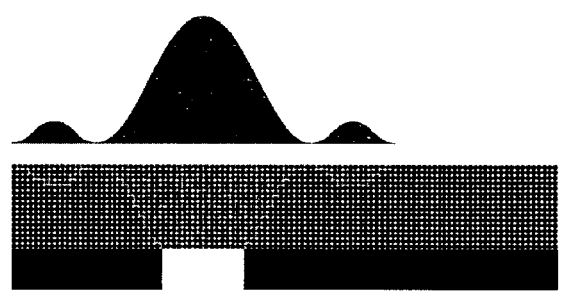
Fig. 4a                    Fig. 4b
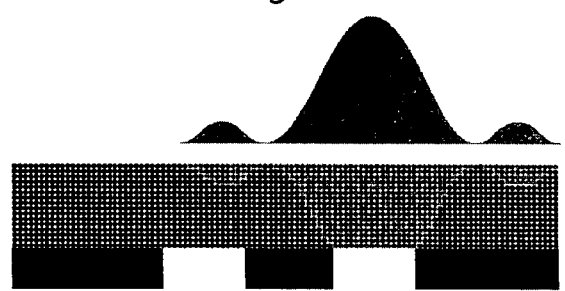
Fig. 4c                    Fig. 4d

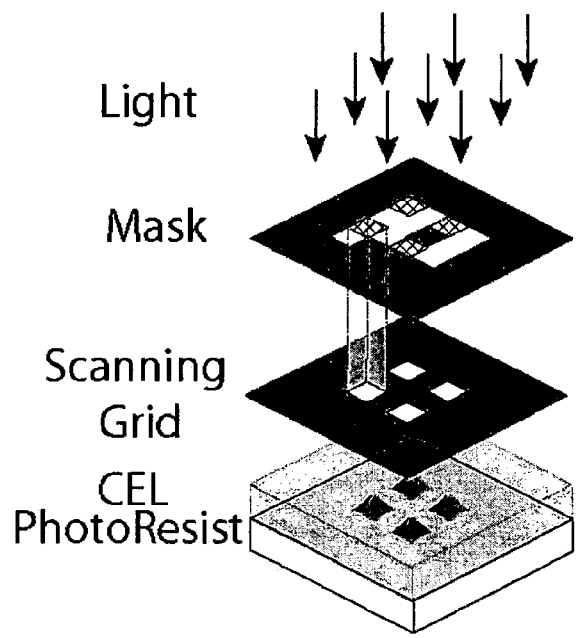
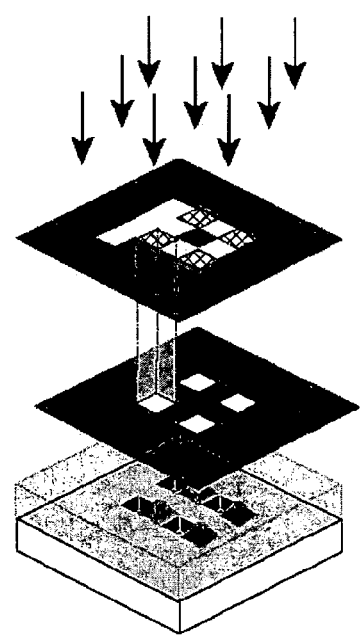
Fig.7a　　　　　　Fig.7b
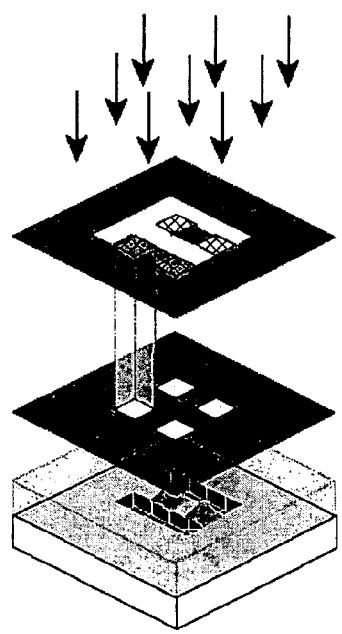
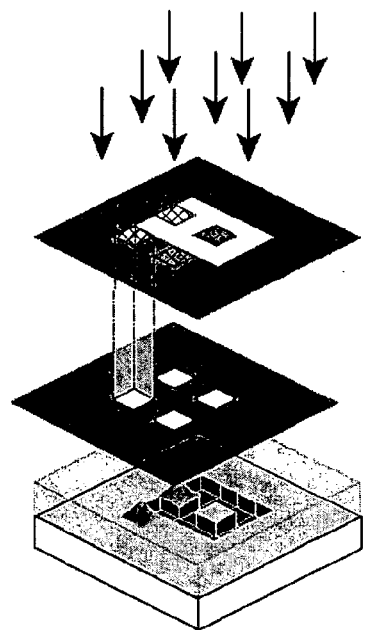
Fig.7c　　　　　　Fig.7d
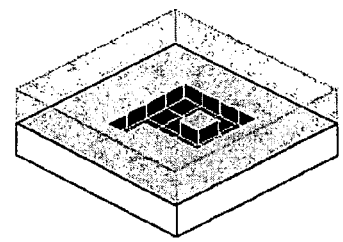
Fig.7e ial application No. 60/431,735 filed Dec. 9, 2002, incorporated herein by reference.

REVERSIBLE PHOTOBLEACHABLE MATERIALS BASED ON NANO-SIZED SEMICONDUCTOR PARTICLES AND THEIR OPTICAL APPLICATIONS

CROSS-REFERENCES TO RELATED APPLICATIONS

This application claims the benefit of priority from provisional application No. 60/431,735 filed Dec. 9, 2002, incorporated herein by reference.

This application is related to U.S. Pat. No. 6,291,110 B1, entitled "Methods for Transferring a Two-Dimensional Programmable Exposure Pattern for Photolithography"; and commonly-assigned application Ser. No. 10/730,381, entitled "Programmable Photolithographic Mask Based On Semiconductor Nano-Particle Optical Modulators" filed concurrently herewith; and commonly-assigned provisional application No. 60/451,240, entitled "Applications of Semiconductor Nano-sized particles in photolithography system"; and commonly-assigned provisional application No. 60/463,626, entitled "Methods of Improving Resolution in a Photolithographic System Using Multi-image Transfer Through Layers to a Photo-resist".

STATEMENT REGARDING FEDERALLY SPONSORED RESEARCH OR DEVELOPMENT

Not applicable.

FIELD

The technology herein relates to reversible photo-bleachable materials. More particularly it relates to the use of semiconductor nano-particles to provide reversible photo-bleaching. Still more particularly, one non-limiting aspect relates to provide applications in photolithography as reversible contrast enhancement layer (R-CEL) and other uses. Still more particularly, one non-limiting aspect relates to provide contrast enhancement in lithographic mask inspection. Still more particularly, one non-limiting aspect relates to provide contrast enhancement in optical data storage.

BACKGROUND AND SUMMARY

Photo-Bleaching Process:

A material is opaque to light of certain wavelength because certain mechanism in this material makes it absorbs photons of that particular wavelength. The absorption sometime induces the degradation or saturation of the light absorption mechanism. This therefore renders the material transparent to the certain wavelength. This process is called photo-bleaching. Most organic dyes photo-bleach. For example, the color of hair fades under prolonged exposure to sunshine.

For many applications, the photo-bleaching should be reversible, i.e., the materials recover their original optical property after the light is turned off. The relaxation process can happen automatically. It can also be triggered by external conditions such as electrical or magnetic field, light at different wavelength, heat, etc.

The photo-bleaching process has a wide range of applications. One non-limiting example is the contrast enhancement material (CEM) in photolithography. The transparency of a CEM varies directly with the intensity of the incident light. In other words, its ability to absorb photons decreases as incident light promotes electrons in the CEM from the ground state into the excited state. A CEM increases the contrast of the image, resulting in improved resolution and depth of focus and reduced interference. These factors in turn allow the fabrication of denser integrated circuits without additional capital equipment investment.

FIG. 1 illustrates a prior art contrast enhancing process in photolithography. The distribution of light intensity from the laser light usually follows Airy pattern. The width of the central peak of the Airy pattern is $1.22\lambda/NA$, where $\lambda$ is the wavelength of the incident light and NA is the numerical aperture of the optical system. In this illustration, only at the center of the spot, where the incident light is most intense, can the light bleaches through the contrast enhancement layer (CEL). Other parts of the Airy Pattern, including the side-lobes, are filtered out by the CEL. Light catalyzes the photo-resist only in the region where it bleaches through. Therefore the resulting line width can be much smaller than the incident wavelength. It is also possible to produce a light pattern with a width smaller than that of the Airy pattern at the cost of putting more power in the side lobes. This is known as apodization. (See co-pending commonly-assigned patent application Ser. No. 10/283,322 entitled "Advanced Exposure Techniques For Programmable Lithography). Apodization can further increase the resolution with the help of CEM. A review of strategies for sub-diffraction limit lithography can be found in an article by S. R. J. Brueck, "International Trends in Applied Optics", SPIE Press, 2002, pp. 85-109.

A prior art example is CEM for 365 nm photolithography manufactured by Shin-Etsu MicroSi. Conventional CEMs, which are based on organic polymers, however, bleach permanently. They do not recover their original property after the incident light is turned off. For lithography processes such as multi-exposure lithography and programmable lithography, reversible contrast enhancement materials (R-CEM) are more relevant. With these lithography methods and a reversible contrast enhancement layer, it is possible to print features finer and denser than the conventional diffraction limit can. See U.S. Pat. No. 6,291,110 B1, entitled "Methods for Transferring a Two-dimensional Programmable Exposure Pattern for Photolithography"; and commonly-assigned provisional patent application No. 60/463,626, entitled "Methods of Improving Resolution in a Photolithographic System Using Multi-image Transfer Through Layers to a Photo-resist";

We propose a new type of photo-bleachable and reversible photo-bleachable materials based on nano-particles of semiconductors. Such type of materials provides reversibility, i.e., they can recover their original properties after the incident light is turned off. Moreover, these materials cover a broad spectrum of the wavelength from far infrared to deep ultraviolet, including the entire spectrum of optical applications.

Semiconductor Nano-Particles:

Nano-particles are loosely defined as powders with diameter ranging from 1 nm to 100 nm. Since they have only been the focus of research in the last two decades, they assumes different names, such as quantum dot, quantum sphere, quantum crystallite, nano-crystal, micro-crystal, colloidal particle, nano-particle, nano-cluster, Q-particle or artificial atom. They also assume different shapes, spherical, cubical, rod-like, tetragonal, single or multiple-walled nano-tubes, etc.

Due to their small size, nano-particles often possess dramatically different physical properties from their bulk counterparts. Nano-particles have a wide range of applications, from metallurgy, chemical sensor, pharmaceutical, painting industry to cosmetics industry. Thanks to the rapid development in synthesis methods in the last two decades, they have now entered into microelectronic and optical applications. Nano-particles of a variety of semiconductors, including those most common ones have been successfully synthesized. A non-exhaustive list includes: C, Si, Ge, CuCl, CuBr, CuI, AgCl, AgBr, AgI, Ag$_2$S, CaO, MgO, ZnO, Mg$_x$Zn$_{1-x}$O, ZnS, HgS, ZnSe, CdS, CdSe, CdTe, HgTe, PbS, BN, AlN, GaN, Al$_x$Ga$_{1-x}$N, GaP GaAs, GaSb, InP, InAs, In$_x$Ga$_{1-x}$As, SiC, Si$_{1-x}$Ge$_x$, Si$_3$N$_4$, ZrN, CaF$_2$, YF3, Al$_2$O$_3$, SiO$_2$, TiO$_2$, Cu$_2$O, Zr$_2$O$_3$, ZrO$_2$, SnO$_2$, YSi$_2$, GaInP$_2$, Cd$_3$P$_2$, Fe$_2$S, Cu$_2$S, CuIn$_2$S$_2$, MoS$_2$, In$_2$S$_3$, Bi$_2$S$_3$, CuIn$_2$Se$_2$, In$_2$Se$_3$, HgI$_2$, PbI$_2$ and their various isomers and alloys. They have revealed very interesting electrical and optical properties.

In a semiconductor material, the possible energy states for electrons are grouped into energy bands. These energy bands are separated by band-gaps where no electron states are allowed. The highest populated energy band is called the valence band and the lowest unpopulated energy band is called the conduction band. When a photon with energy less than the band-gap that separates the valence band and conduction band is incident on the semiconductor material it will not be absorbed. However, if the photon has energy higher than the band-gap, it will be absorbed by promoting an electron from the top of the valence band to the bottom of the conduction band. Meanwhile this process will leave an empty electron state, a hole, at the top of the valence band. In reality, the electron-hole pair created by the photon forms an entity resembling a hydrogen atom, called an "exciton". The Coulomb attraction between the electron and hole will lower their energy. Therefore photons with energy slightly less than the band-gap can be absorbed. The lowest energy where absorption occurs is called the absorption edge. If all the electron and hole pairs corresponding to certain photon energy are excited to form excitons, no more absorption can occur, and the material is "bleached". Hence semiconductors are bleachable materials.

Excited carriers in a semiconductor have a finite life-time. After this time the semiconductor relaxes by recombination of electrons and holes. Hence after the light is turned off, a bleached semiconductor can recover its original optical property. In other word, the bleaching process in a semiconductor is reversible. The relaxation process can also be triggered by external conditions such as electrical field, magnetic field, light with different wavelength, heat, etc.

The amount of light with a given energy that a semiconductor can absorb is proportional to its density of states (DOS), that is, the number of electron and hole states available at this energy. Semiconductors in bulk and thin film form do not bleach easily. The bulk DOS is large and requires a high light intensity, it is shown in FIG. 2a. One way to decrease the density of state is through the quantum size effects. When the size of a semiconductor becomes very small, the energy levels of electrons and holes are no longer continuous. They are quantized into discreet levels. Usually when the thickness of a thin film approaches several tens of nanometer, the material becomes "two dimensional" and its DOS become stair-like, as seen in FIG. 2a. FIG. 2b depicts the DOS of a "one dimensional" wire with a thickness less than a few tens of nanometer. Finally, in FIG. 2c when the material reaches the "zero dimensional" quantum-dot, its density of state becomes discreet delta functions, similar to atomic or molecular energy levels. Although in reality the states of a nano-particle are a little smeared out and look like the dotted lines in FIG. 2d, the DOS usually is still significantly smaller than the bulk.

Furthermore, nano-particles can be easily dispersed and diluted hence it is much easier to observe photo-bleaching. Strong power dependent absorption has been observed in CdSxSe1-x nano-particles. As described in the book entitled "Optical Properties of Semiconductor Nanocrystals" to S. V. Gaponenko, Cambridge Univ. Press, 1998, Chapter 6.

Another distinctive feature of semiconductor nano-particle is the tunabillity of the absorption edge by its size. In a nano-particle, the electrons and holes are much closer to each other in this confined space than in bulk. Therefore the Coulomb interaction between electrons and holes are much stronger than in the bulk. For optical applications, it is convenient to categorize the semiconductor nano-particles relative to their bulk exciton size $a_B$. If the size of a particle $a > a_B$, it is in the weak confinement regime. If $a < a_B$, then it is in the strong confinement regime.

In the weak confinement regime, the nano-particles can still be treated as bulk materials. The quantization of the electron and hole energy is much less than the quantization of the exciton energy levels. Therefore the change in optical properties is mainly due to the change of exciton energy. A qualitative formula for the exciton ground state is expressed in equation (1), as described in an article by Al. L Efros, A. L. Efros, Sov. Phys. Semicon. 1982,16:772-78.

$$\hbar\omega = E_g - E_x + \frac{\hbar^2\pi^2}{2(m_e + m_h)a^2} \quad (1)$$

where $E_g$ is the bulk value for band-gap, $E_x$ is the bulk value for exciton ground energy, $m_e$ and $m_h$ are the effective masses of electron and hole respectively, h is the Plank constant and $\omega$ is the angular frequency of the photon. It can be immediately seen from this equation that the absorption peak energy corresponding to the exciton increases rapidly with size reduction.

In the strong confinement case, the nano-particle can not be treated as bulk materials and the Coulomb interaction can not be described as a hydrogen-like entity. The energy levels for electrons and holes no longer form continuous bands. But rather, they form well separated discreet levels, like in atoms or molecules. A largely simplified model for absorption spectrum of nano-particles in the strong confinement regime is described in equation (2), as described in an article by L. E. Brus, J. Chem. Phys. 1983, 79:5566-71.

$$\hbar\omega = E_g - \frac{1.8q^2}{\kappa a} + \frac{\hbar^2\pi^2}{2(m_e + m_h)a^2} \quad (2)$$

where $E_g$ is the bulk band-gap, $m_e$ and $m_h$ are the effective masses of the electron and hole respectively, q is the electron charge, $\kappa$ is a constant, h is the Plank constant and $\omega$ is the angular frequency of the photon. In equation (2) the absorption edge again increases rapidly with decreasing size. This effective band-gap widening effects has been observed in many materials. As an extreme example, Cd$_3$P$_2$, its band-gap increases from its bulk room temperature value of 0.5 eV to about 2 eV for nano-particles with 2.7 nm diameter.

There is a variety of ways of manufacturing nano-particles. An non-exhaustive list includes chemical vapor deposition (CVD), chemical mechanical polishing (CVP), self-organized growth on vicinal substrates in various film deposition techniques, laser ablation, plasma assisted decomposition, sol-gel synthesis, electro-explosion, and chemical synthesis. Nano-particles with average particle size as small as <1 nm with different shapes can be produced. Nano-particles with core in the middle and shell made of different materials can also be produced. If the standard deviation of the size distribution of nano-particles is smaller than 5%, it is called a mono-dispersion. It is also feasible to manipulate the mono-disperse nano-particles into ordered or disordered close-packed assemblies possessing very different properties as their bulk properties. A review of mono-disperse nano-particles can be found in an article "Synthesis and Characterization of Monodisperse Nanocrystals and Close-Packed Nanocyrstal Assemblies", C. B. Murray, C. R. Kagan and M. G. Bawendi, Annu. Rev. Mater. Sci. 2000, 30:545-610.

When electrons from inner shells of semiconductor atoms are excited into the conduction gap, they can absorb lights in the EUV and soft X-ray spectra. The absorption of inner shell electrons bleaches in the same manner as those valence band electrons. Therefore reversible photo-bleachable materials for EUV or soft X-ray can also be developed based on semiconductor nano-particles with proper energy levels.

In summary, advantages of using semiconductor nano-particles as reversible photo-bleachable materials include:

Most semiconductors can be fabricated into nano-particles with relatively low cost. The different band-gap of different semiconductors can cover from far infrared to ultra-violet. For example, GaAs can be used for infrared light, AlGaAs and InGaN for the visible light, and AlGaN and MgZnO for ultra-violet light. Even for application like 193 nm and 157 nm UV photolithography, suitable material systems, such as MgZnO, exist.

Easy to apply. Nano-particles are easy to be formed into thin film or bulk with different shapes. Thus reduces the overall cost of optical applications.

The absorption edge of nano-particles can be tuned by changing their size. This adds another degree of freedom and simplicity to the design. For example, in the application of UV photolithography, same CEM can work at 365 nm and 248 nm, even 193 nm, only with different particle size.

Electronic states in nano-particles are highly localized within the particles. Therefore an assembly of nano-particles resolve light distribution with high spatial frequency.

The relaxation time can be manipulated from pico-second to seconds, provided that certain measures are taken. It covers time scale required for most optical applications. An example is shown in Gribkovskii et al, "Optical Nonlinearity of Semiconductor Microcrystal $CdS_xSe_{1-x}$ Under the Action of Picosecond and Nanosecond Laser Pulses", Phys. Stat. Sol. (b) 158: 359-66 (1988), where the surface passivated material relaxed in less than a nano-second. An example on the other extreme can be seen in "Organic-Capped ZnO Nanocrystals", M. Shim and Philippe Guyot-Sionnest, J. Am. Chem. Soc., 2001, 123, 11651. In this article it is demonstrated that in ZnO nanocrystal relaxation time varies from minutes to days.

BRIEF DESCRIPTION OF THE DRAWINGS

These and other features and advantages will be better and more completely understood by referring to the following detailed description of presently preferred illustrative embodiments in conjunction with the drawings, of which:

FIGS. 4a-4d show the use of an exemplary illustrative reversible contrast enhancement layer in combination with multiple exposures separated in time and space;

FIG. 7a-FIG. 7e show an exemplary illustrative method of using R-CEL, combined with multiple exposures separated in time and position created by using a single mask and changing other elements in the optical system, to increase pattern resolution.

Figure 1:
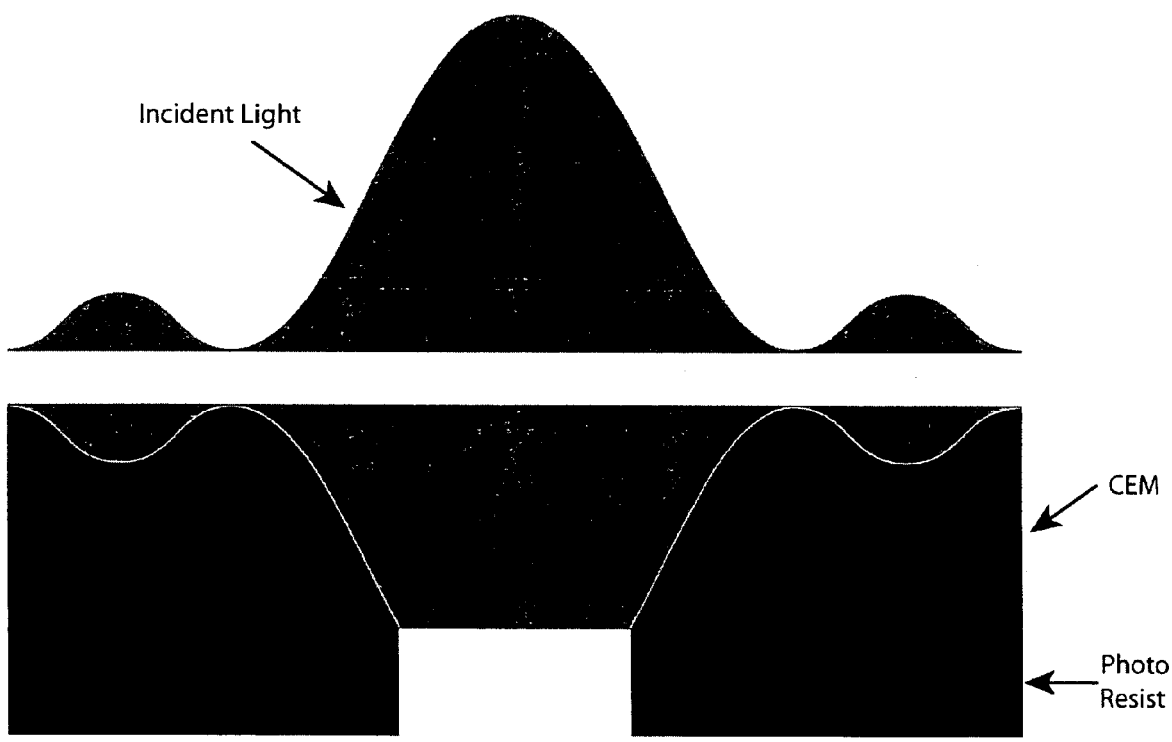
FIG. 1 is an exemplary illustration of a prior art contrast enhancement layer and its effect on a light pattern.
Figure 2A:
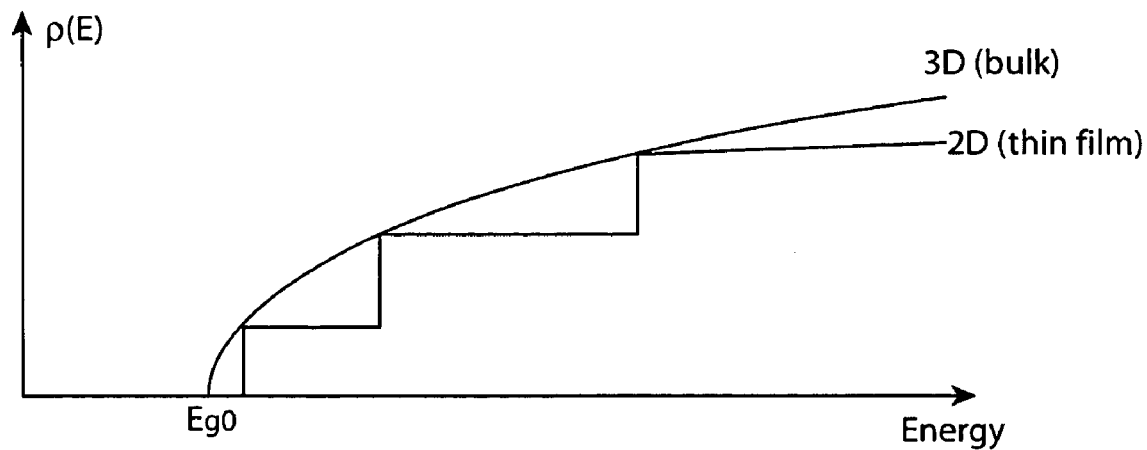
FIGS. 2a-2c show exemplary illustrative density of states for various dimensional semiconductor material systems.
Figure 2B:
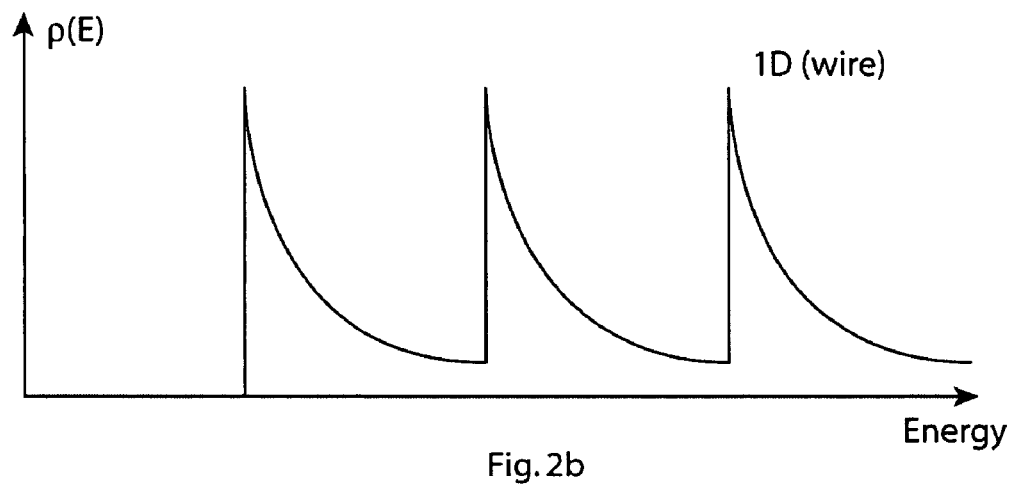
Figure 2C:
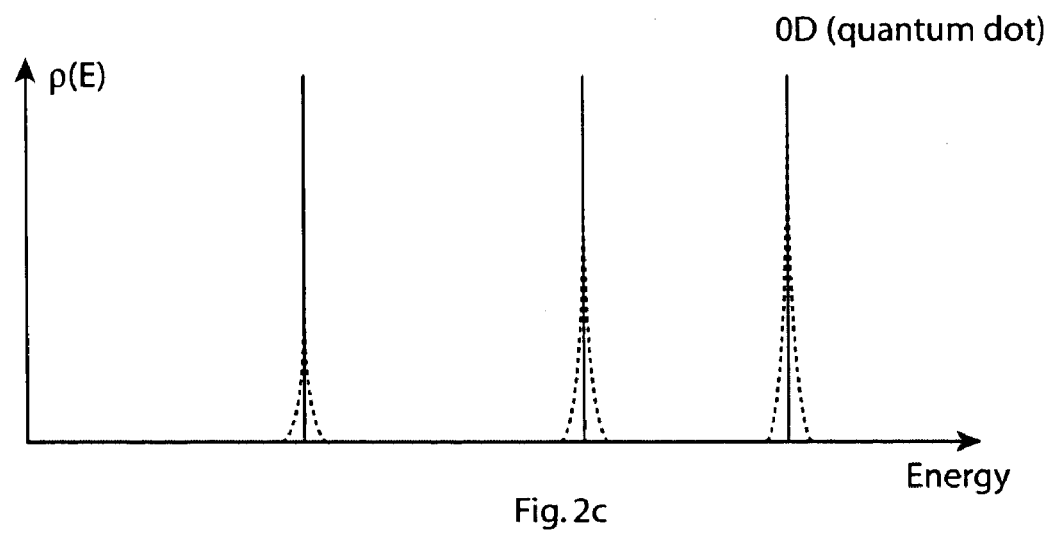

DETAILED DESCRIPTION OF PRESENTLY PREFERRED NON-LIMITING ILLUSTRATIVE EMBODIMENTS

One preferred exemplary non-limiting illustrative embodiments provides a contrast enhancement material comprising semiconductor nano-sized particles. Said semiconductor may exhibit a band-gap in its electronic structure; a non-exhaustive list of said particles may include: C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, GaN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, YF3, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$ and their various isomers and alloys; said particles may be in spherical, cubical, rod-like, tetragonal, single or multi-wall nano-tube or other nano-scale geometric shapes; and particle may be doped by other elements; said particles may be coated with one or more shells of other materials; and said shell material may comprise any known materials.

Said contrast enhancement material may comprises nano-particles immersed in polymer matrix and other chemicals; said contrast enhancement material materials may be spun, sprayed, rinsed, dipped, evaporated or deposited by any thin film growth technique, on to a surface to form a reversible photo-bleachable layer; Said contrast enhancement material may be used in photolithography at 365 nm, 257 nm 248 nm, 198 nm, 193 nm, 157 nm, 121 nm and other practical wavelengths.

Another preferred exemplary non-limiting illustrative embodiments provides a reversible photo-bleachable material comprising semiconductor nano-sized particles. Said semiconductor may exhibit a band-gap in its electronic structure; a non-exhaustive list of said particles may include: C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, GaN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, YF3, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$ and their various isomers and alloys; said particles may be in spherical, cubical, rod-like, tetragonal, single or multi-wall nano-tube or other nano-scale geometric shapes; and particle may be doped by other elements; said particles may be coated with one or more shells of other materials; and said shell material may comprise any known materials.

Said reversible photo-bleachable material may comprises nano-particles immersed in polymer matrix and other chemicals; said reversible photo-bleachable materials may be spun, sprayed, rinsed, dipped, evaporated or deposited by any thin film growth technique, on to a surface to form a reversible photo-bleachable layer.

Upon photon illumination, said reversible photo-bleachable material may become more transparent to the wavelength of said photon; said material may become more transparent to wavelength other than actinic wavelength; said reversible photo-bleachable material may recover at least part of its original opacity in a certain period of time after the said illumination is turned off; said illumination may comprises photon wavelength from far infrared to deep UV; and said reversible photo-bleachable material may comprises particles with different compositions and structures.

Another aspect of preferred exemplary non-limiting illustrative embodiments of a reversible photo-bleachable material comprises providing a reversible contrast enhancement (R-CEL) based on semiconductor nano-particles. Said R-CEL may work in the spectrum from far-infrared to deep UV in lithography or optical storage to increase the resolution of the image or storage density.

Figure 3A:
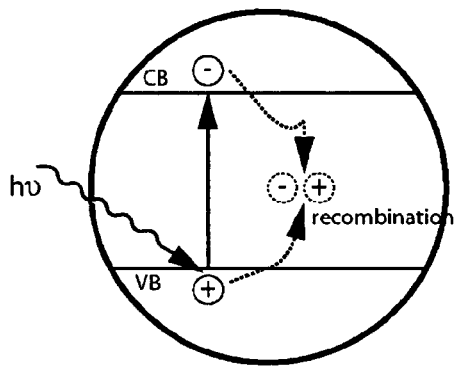
FIG. 3a shows an exemplary illustrative generic light absorption and recombination process in a semiconductor nano-particle.

One preferred exemplary non-limiting illustrative embodiments provides a method to adjust the relaxation of said nano-particles in said reversible photo-bleachable material comprises mechanism of separating photon-generated electrons and holes. As shown in FIG. 3a, in an isolated nano-particle, the electron-hole pair generated by the light will eventually recombine in the same particle. A mechanism to increase electrons and holes lifetime may be to separate said electrons and holes.

Figure 3B:
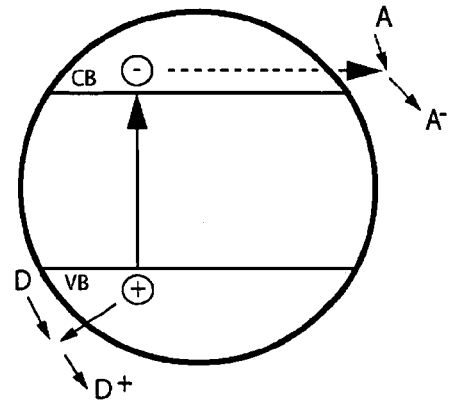
FIG. 3b shows an exemplary illustrative process removal of a photo-induced electron or hole from an illustrative nano-particle to a surrounding solvent.

Another aspect of preferred non-limiting illustrative method of adjusting the relaxation time of said reversible photo-bleachable material comprises, as shown in FIG. 3b: providing extra electronic states at the surface of said nano-particles. Said electronic states may be manipulated to provide adjustable relaxation time of said reversible photo-bleachable material.

Said electronic states may function as an electron donor or acceptor, namely, said electronic states may accept electrons (acceptor) or holes (donor) when they are generated by actinic photons; said electronic states may withhold the said electrons or holes for a certain period of time; said electrons and holes eventually recombine to allow said nano-particles to recover to at least part of their original opacity; said electronic states may be created by the dangling bonds at the said surface; or by capping said nano-particles with certain chemical surfactants; or by capping another semiconductor material. An example is that pyridine can behave as an electron donor when capped onto a CdSe nano-particle. A review of a prior art can be seen in the article "Mechanisms for intra-band energy relaxation in semiconductor quantum dots: The role of electron-hole interactions", V. I. Klimov, A. A. Mikhailovsky, and D. W. McBranch, Phys. Rev. B. 61, 2000, p.R13349.

Another aspect of preferred non-limiting illustrative method of adjusting the relaxation time of said reversible photo-bleachable material comprises: doping said nano-particles with transitional metals. Said dopants create trap states in the nano-particles; said trap states withhold the photo-generated electrons or holes during and after the exposure; said electrons and holes eventually recombining to allow said nano-particles recover to at least part of their original opacity. An example in the prior art is Fe doped $TiO_2$ nano-particles as described in an article by E. C. Butler and A. P. Davis, J. Photochem, Photobiol., A: Chem. 1993, 70.273.

Another aspect of preferred non-limiting illustrative method of adjusting the relaxation time of said reversible photo-bleachable material comprises: providing surfactant to said nano-particles. Said surfactant provides electronic states to withhold photo-generated electrons or holes for a certain period of time; said electrons and holes eventually recombine to allow said nano-particles recover to at least part of their original opacity; said surfactant photo-bleach at the actinic wavelength when withholding said electrons or holes; said surfactant relax to at least part of its original opacity when said electrons or holes are removed from said electronic states.

Figure 3C:
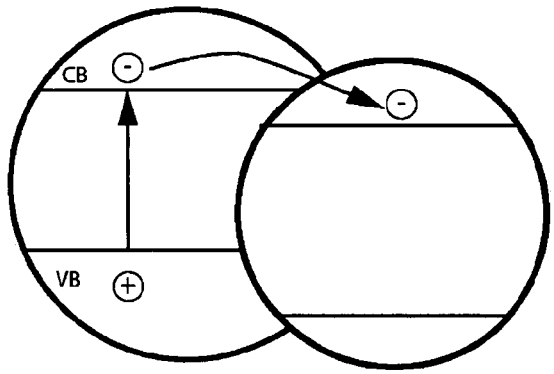
FIG. 3c shows an exemplary illustrative process of removal of a photo-induced electron or hole from an illustrative nano-particle to an adjacent nano-particle with offset band-gaps.

Another aspect of preferred non-limiting illustrative method of adjusting the relaxation time of said reversible photo-bleachable material comprises, as shown in FIG. 3c: providing a mixture of two types of nano-particles. The band-gaps of the two said types of nano-particles are offset relative to each other; photo-generated electrons or holes are separated due to said offset of said band-gaps; said electrons and holes eventually recombine to allow said nano-particles recover to at least part of their original opacity. For simplicity, FIG. 3c only shows that electrons are removed under the given illustrative band structure.

Figure 3D:
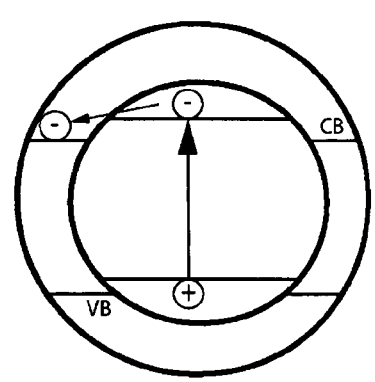
FIG. 3d shows an exemplary illustrative movement of a photo-induced electron or hole from one layer of an illustrative multi-layer nano-particle to another layer of the nano-particle.

Another aspect of preferred non-limiting illustrative method of adjusting the relaxation time of said reversible photo-bleachable material comprises, as shown in FIG. 3d: providing said nano-particles with a shell including another type of semiconductor (this type of particle is called "composite nano-particles"). Band-gap of said shell semiconductor has offsets relative to the core semiconductor; photo-generated electrons or holes are separated due to said offset of said band-gaps; said electrons and holes eventually recombine to allow said nano-particles recover to at least part of their original opacity. For simplicity, FIG. 3d only shows that electrons are removed under the given illustrative band structure. A brief review on composite nano-particle prior art can be found in the article "Structure and Photophysics of Semiconductor Nanocrystals", A. Eychmuller, J. Phys. Chem. B 2000, 104, 6514-6528.

Figure 3E:
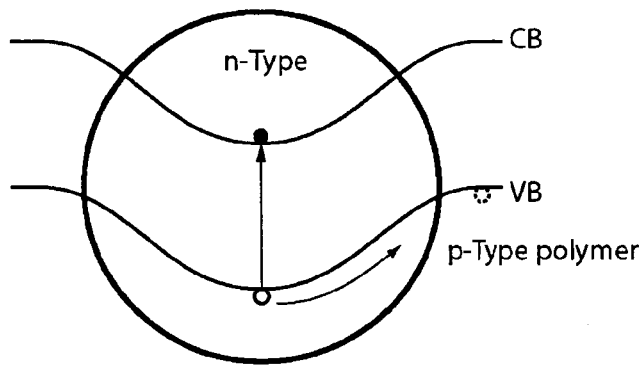
FIG. 3e shows an exemplary illustrative system of n-type nano-particles submerged in a p-type polymer matrix.

Another aspect of preferred non-limiting illustrative method of adjusting the relaxation time of said reversible photo-bleachable material comprises doped nano-particles and polymer matrix. As shown in FIG. 3e, an n-type nano-particle is submerged in a p-type polymer matrix. A built-in electrical field is therefore established at the interface. Here n-type is defined as semiconductor with excess electrons at the bottom of the conduction band. While p-type is defined as semiconductor with excess holes at the top of the valence band. Photo-generated electrons or holes are separated due to said offset of said built field; said electrons and holes eventually recombine to allow said nano-particles recover to at least part of their original opacity. P-type nano-particles submerged in an n-type polymer works in a similar fashion.

Another aspect of preferred non-limiting illustrative method of adjusting the relaxation time of said reversible photo-bleachable material is that even without n or p type character of the surroundings chemicals, due the difference of work functions, doped nano-crystals will have a built-in field at the surface. The exact direction of the field is determined by the relative Fermi levels of the nano-crystal and the surrounding chemicals. For n-type nano-particles, to prolong the relaxation time, the initial Fermi-level of the surrounding chemical should be lower; for p-type nano-particle, higher.

Another aspect of preferred non-limiting illustrative method of adjusting the relaxation time of said reversible photo-bleachable material comprise, nano-particles; a p-type or n-type or undoped polymer matrix; Photo-generated electrons or holes undergoing Auger recombination in nano-particles, electrons or holes being ejected out and left the particles charged; charged particles becoming transparent to actinic wavelength due to Quantum confined Stark Effect; said charged nano-particles being neutralized to allow said nano-particles recover to at least part of their original opacity.

Figure 3F:
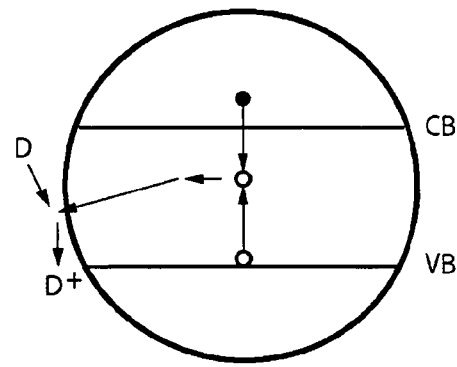
FIG. 3f shows an illustrative process where an electron is ejected via Auger recombination process.

As shown in FIG. 3f, Auger recombination is a radiationless process where an electron-hole pair or many electron-hole pairs recombine and transfer their energy to another carrier. This carrier therefore could gain enough energy to be ejected out of the particle. Therefore the particle is ionized and further absorption is suppressed, due to quantum confined Stark effect, until the particle is neutralized again. This process manifested itself as random "blinking" in the nano-crystal photoluminescence, as described in an article: "Quantum-Confined Stark Effect in Single CdSe Nanocrystallite Quantum Dots", S. A. Empedocles and M. G. Bawendi, Science, 1997, 278, p2114. To modify the relaxation time, we only have to cap or mix the nanocrystals with donor or acceptor chemicals so that the generated carriers can be withheld for the desired period of time.

Another preferred exemplary non-limiting illustrative embodiment provides method of exposing a wafer comprising: A substrate, structured or non-structured; having a layer of photo-resist thereon; a photon illuminating; providing a contrast enhancement layer containing semiconductor nano-particles; a mask; passing said illuminating through said mask to create pattern on said CEL; and said light pattern bleaches said CEL and expose at least part of said photo-resist.

Another preferred exemplary non-limiting illustrative embodiment provides method of exposing a wafer comprising: A substrate, structured or non-structured; having a layer of photo-resist thereon; a pulsed photon illuminating; providing a R-CEL containing semiconductor nano-particles; a mask; passing said illuminating through said mask to create pattern on said R-CEL; and said light pattern bleaches said R-CEL and expose at least part of said photo-resist.

Another aspect of preferred non-limiting illustrative method of exposing a substrate having a photo-resist thereon comprises providing a R-CEL on said substrate, as shown in FIG. 4a; passing one said pulse or multiple said pulses of said illuminating through at least part of said mask to create pattern on said R-CEL, as shown in FIG. 4b; relaxing said R-CEL, as shown in FIG. 4c; passing one said pulse or multiple said pulses of said illuminating through at least part of said mask to create another pattern on said R-CEL, as shown in FIG. 4d; and said R-CEL bleaches in response to said illuminating in both exposures. As evidently shown in these figures, this method could create smaller features and pitches than the optical diffraction limits would allow. It also can create smaller pitches than the non-reversible contrast enhancement layer would allow.

Another aspect of preferred non-limiting illustrative method of exposing a substrate having a photo-resist thereon comprises providing R-CEL on said substrate; providing multiple exposures separated by time; each said exposure comprising one said pulse or multiple said pulses of said illuminating through at least part of said mask to create a pattern on said R-CEL; said R-CEL bleaches in response to said illuminating in all said exposures; and said separations of time are long enough to relax said R-CEL.

Another aspect of preferred non-limiting illustrative method of exposing a substrate having a photo-resist thereon comprises providing an R-CEL on said substrate, a second mask having an arrangement of light areas, i.e. squares, is placed in the optical path. The second said mask prevents certain parts of the pattern from the first mask from forming image on the resist during one exposure. The wafer stage moves the wafer and the second mask relative to the first mask. In the second exposure, the second mask prevents certain parts of the pattern from the first mask from forming image on the resist. The R-CEL is allowed to relax between exposures. As shown from FIG. 7a to FIG. 7d, this sequence of movements and exposures can be continued to fill in the final desired pattern, illustratively shown in FIG. 7e. The arrangement of light passing and blocking areas in the second mask could take many forms, including isolated transparent areas, such as squares or other geometric shapes, a checkerboard of squares or hexagons, a line of light and dark regions, multiple lines of light and dark regions, or any other arrangement of some substantially light passing and some substantially light blocking regions. For the sake of simplicity, other parts of a lithographic system, such as demagnification optics, are not shown in FIG. 7.

Another aspect of preferred non-limiting illustrative method of exposing a substrate having a photo-resist thereon comprises providing R-CEL on said substrate; passing one said pulse or multiple said pulses of said illuminating through one mask to create a pattern on said R-CEL; relaxing said R-CEL; passing one said pulse or multiple said pulses of said illuminating through another mask to create another pattern on said R-CEL; and said R-CEL bleaches in response to said illuminating in both exposures.

Another aspect of preferred non-limiting illustrative method of exposing a substrate having a photo-resist thereon comprises providing R-CEL on said substrate; providing multiple exposures separated by time; each said exposure comprising one said pulse or multiple said pulses of said illuminating through one mask to create a pattern on said R-CEL; said R-CEL bleaches in response to said illuminating in all exposures; and said separations of time are long enough to relax said R-CEL.

Another aspect of preferred non-limiting illustrative method of exposing a substrate having a photo-resist thereon comprises providing R-CEL on said substrate; a programmable mask; providing two or multiple exposures separated by time; each said exposure comprising one said pulse or multiple said pulses of said illuminating through said mask to create a pattern on said R-CEL; said R-CEL bleaches in response to said illuminating in all exposures; said programmable mask maybe re-programmed into another pattern during said separations of time; said substrate may be moved relative to said programmable mask during said separation of time; and said separations of time are long enough to relax said R-CEL. A detailed description can be found in U.S. Pat. No. 6,291,110 B1, entitled "Methods for Transferring a Two-Dimensional Programmable Exposure Pattern for Photolithography".

Figure 5:
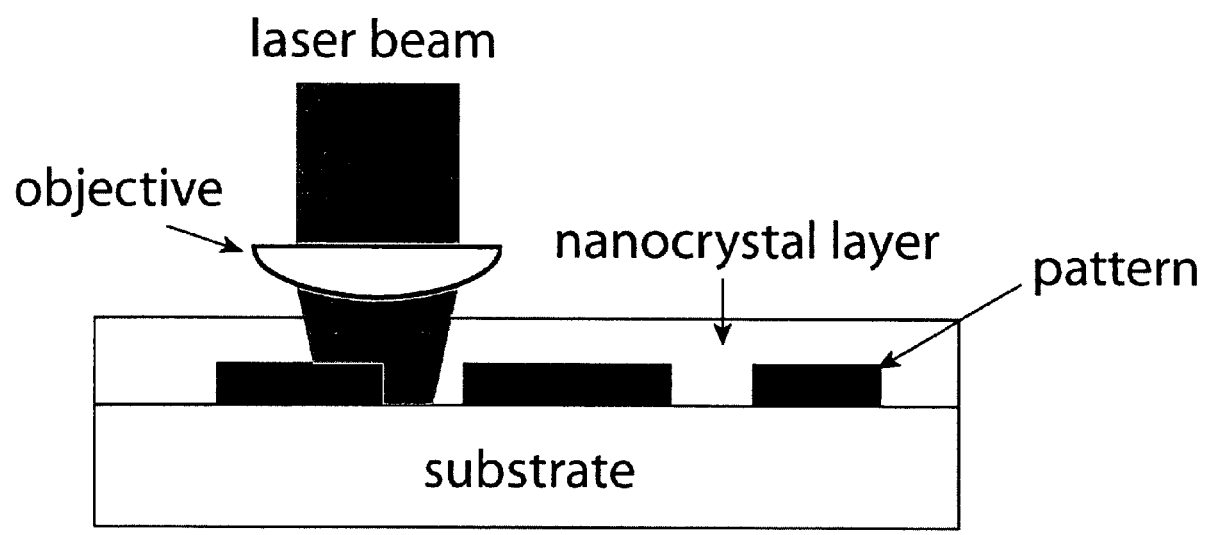
FIG. 5 shows an exemplary illustrative method of lithography mask inspecting using a reversible contrast enhancement layer.

Another exemplary non-limiting illustrative embodiment provides a method of resolution enhancement for lithography mask inspection. The purpose of said inspection is to detect defects or contamination of said mask. The said method comprises, as shown in FIG. 5: a mask; a laser beam; an optical objective focuses said laser beam onto said pattern; providing layer of R-CEL containing said reversible bleachable material on top of said mask; a detector or detectors to detect the reflected or transmitted light of said laser beam; and a mechanism to scan the laser beam across the entire area of said mask. The mask may comprise a quartz substrate and a chrome pattern. By applying a R-CEL, the resolution of the mask inspector is improved.

Another exemplary non-limiting illustrative embodiment provides a method of resolution enhancement for lithography mask writing. The said method comprises: a blank mask; a layer of photoresist thereon; a said reversible bleachable material comprising semiconductor nano-particles on top of said photoresist, a laser beam; an optical system focuses said laser beam onto said photoresist; and a mechanism to scan the laser beam across the entire area of said mask to expose said resist. The mask may comprise a quartz substrate and a chrome layer. The minimal feature written depends on the focused spot by said objective, which is close to the diffraction limit. By applying a R-CEL, the size of the focused light spot may be greatly reduced by trimming off the less intensive part. Therefore improve the resolution of the inspection tool.

Figure 6A:
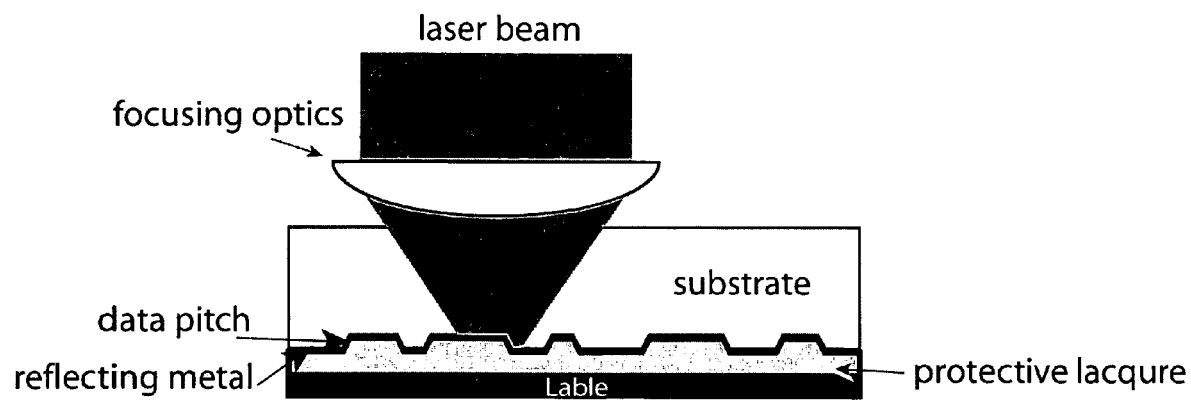
FIG. 6a shows an exemplary illustrative data extracting mechanism of optical storage device such as compact disc (CD) or digital versatile disc (DVD). Similar design can also be used for data recording in a rewritable optical storage device.
Figure 6B:
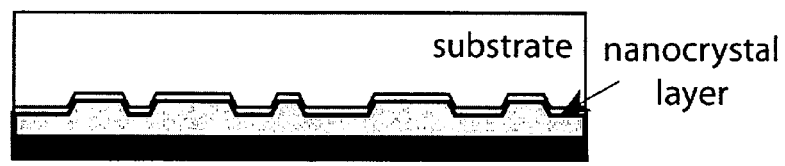
FIGS. 6b-6d show different exemplary illustrative methods of incorporating reversible bleachable materials to improve the data writing density and read resolution.

Another preferred exemplary non-limiting illustrative embodiment provides an optical storage device, similar to compact disc (CD) or digital versatile disk (DVD). As shown in FIG. 6a. In a typical CD or DVD, the data is stored by pitches on a clear substrate, usually made of polycarbonate. The substrate is coated with reflective metal so the reading laser beam can be reflected. The minimum pitch that can be read by the system is determined by the focused spot size, which is determined by the diffraction limit. By applying a R-CEL between the reflecting metal and the pitches, as depicted in FIG. 6b, the focused spot can be greatly reduced. This therefore increases the minimum pitch that can be read that in turn leads to increased storage capacity of each individual disc.

The said preferred exemplary non-limiting illustrative embodiment comprises, as shown in FIG. 6b: a substrate having information-bearing indicia thereon, and a R-CEL disposed on at least part of information bearing side of said substrate, a reflecting metal disposed after the said reversible photo-bleachable layer, a laser beam; an optical objective focuses said laser beam onto the said pattern; a detector or detectors to detect the reflected or transmitted light of said laser beam; and a mechanism to scan the laser beam across the entire area of said mask. The R-CEL may contain nano-particles. The substrate may comprise a plastic disk.

Figure 6C:
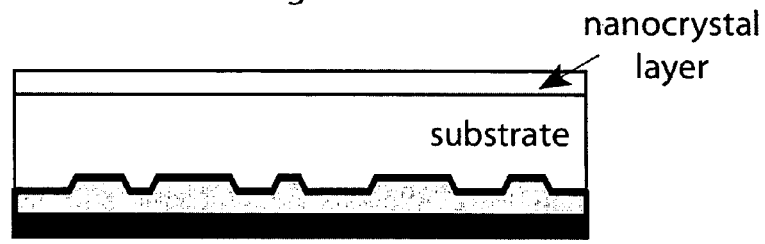

Another aspect of preferred exemplary non-limiting illustrative embodiment comprises, as shown in FIG. 6c: a substrate having information-bearing indicia thereon, and a R-CEL disposed on at least part of flat side of said substrate, a reflecting metal disposed on the information bearing indicia, a laser beam; an optical objective focuses said laser beam onto the said pattern; a detector or detectors to detect the reflected or transmitted light of said laser beam; and a mechanism to scan the laser beam across the entire area of said mask. The R-CEL may contain nano-particles. The substrate may comprise a plastic disk.

Figure 6D:
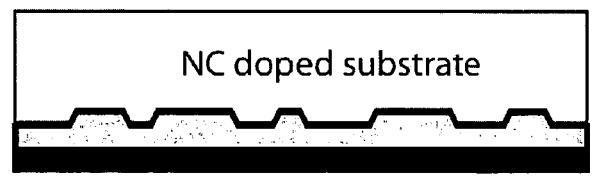

Another aspect of preferred exemplary non-limiting illustrative embodiment comprises, as shown in FIG. 6d: a substrate having information-bearing indicia thereon, a reflecting metal disposed on the information bearing indicia, a laser beam; an optical objective focuses said laser beam onto the said pattern; a detector or detectors to detect the reflected or transmitted light of said laser beam; and a mechanism to scan the laser beam across the entire area of said mask. The substrate may comprise mixture of reversible photo-bleachable material and plastic.

Another non-limiting aspect may provide an optical storage device reader or writer comprising: a receptacle adapted to receive a substrate having optically-scannable information-bearing indicia and a R-CEL thereon; and a laser scanner arrangement that, in use, writes and/or scans said information-bearing indicia through said reversible contrast enhancement layer. The laser scanner arrangement may be adapted to provide fine positional control to take advantage of close spacing of said information-bearing indicia provided by said reversible contrast enhancement layer.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the scope of the appended claims.

We claim:

1. A method of exposing a semiconductor wafer having at least a photoresist thereon, said method comprising:
    disposing said photoresist onto said semiconductor wafer;
    coating, on top of said photoresist, a contrast enhancement layer comprising a reversible photo bleachable material including nanoparticles;
    providing a light source;
    illuminating at least one mask with said light source;
    collecting light passing through said at least one mask and creating at least one light pattern;
    said at least one light pattern at least in part photobleaching said contrast enhancement layer, said nanoparticles providing at least part of said photobleaching;
    said at least one light pattern exposing said photoresist after passing through said contrast enhancement layer.

2. The method of claim 1 wherein said nanoparticles comprise at least one of the following: : C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, GaN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, YF3, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$ and their various isomers and alloys.

3. The method of claim 1 wherein said nanoparticles are in spherical, cubical, rod-like, tetragonal, single or multi-wall nano-tube or other nano-scale geometric shapes.

4. The method of claim 1 wherein said nanoparticles are immersed in polymer matrix or other chemicals.

5. The method of claim 1 wherein the nanoparticles are doped with other elements.

6. The method of claim 1 wherein the nanoparticles are coated with other semiconductors or chemicals.

7. The method of claim 1 further including separating photo-generated electrons and holes in said nanoparticles.

8. The method of claim 1 further including providing carrier accepting surface states in said nanoparticles.

9. The method of claim 1 further including providing chemical surfactant at the surface of said nanoparticles.

10. The method of claim 1 wherein said nanoparticles comprise plural types of nanoparticles with different bandgaps.

11. The method of claim 1 wherein said nanoparticles have a bandgap, and the method further includes providing, at the surface of said nano-particles, a semiconductor coating with a band-gap different from the band-gap of said nanoparticles.

12. The method of claim 1 wherein said nano-particles include a n-type nano-particle within a p-type polymer matrix.

13. The method of claim 1 wherein said nanoparticles comprise at least one p-type nanoparticle within an n-type polymer matrix.

14. The method of claim 1 wherein said nanoparticles comprise n-type nano-particle or p-type nano-particles in a non-doped polymer matrix.

15. The method of claim 1 further including inducing Auger recombination of multiple electron and hole pairs in said nano-particles.

16. The method of claim 1 wherein said illuminating comprises providing multiple exposures separated in time.

17. The method of claim 16 further including allowing said reversible contrast enhancement layer to relax between at least some of said multiple exposures.

18. the method of claim 16 wherein said illuminating comprises illuminating with light having a wavelength of 157 nm.

19. the method of claim 16 wherein said illuminating comprises illuminating with light having a wavelength of 193 nm.

20. the method of claim 16 wherein said illuminating comprises illuminating with light having a wavelength of 248 nm.

21. the method of claim 16 wherein said illuminating comprises illuminating with light having a wavelength of 365 nm.

22. the method of claim 17 wherein said illuminating comprises illuminating with light having a wavelength of 157 nm.

23. the method of claim 17 wherein said illuminating comprises illuminating with light having a wavelength of 193 nm.

24. the method of claim 17 wherein said illuminating comprises illuminating with light having a wavelength of 248 nm.

25. the method of claim 17 wherein said illuminating comprises illuminating with light having a wavelength of 365 nm.

26. The method of claim 1 wherein said illuminating comprises providing multiple different exposure patterns separated in position on said substrate.

27. the method of claim 26 wherein said illuminating comprises illuminating with light having a wavelength of 157 nm.

28. the method of claim 26 wherein said illuminating comprises illuminating with light having a wavelength of 193 nm.

29. the method of claim 26 wherein said illuminating comprises illuminating with light having a wavelength of 248 nm.

30. the method of claim 26 wherein said illuminating comprises illuminating with light having a wavelength of 365 nm.

31. The method of claim 26 further including allowing said nano-particles to relax between at least some of said multiple exposures.

32. The method of claim 31 further including using said bleachable enhancement layer to create images or patterns with higher resolution than the diffraction limit allows.

33. the method of claim 32 wherein said illuminating comprises illuminating with light having a wavelength of 157 nm.

34. the method of claim 32 wherein said illuminating comprises illuminating with light having a wavelength of 193 nm.

35. the method of claim 32 wherein said illuminating comprises illuminating with light having a wavelength of 248 nm.

36. the method of claim 32 wherein said illuminating comprises illuminating with light having a wavelength of 365 nm.

37. the method of claim 31 wherein said illuminating comprises illuminating with light having a wavelength of 157 nm.

38. the method of claim 31 wherein said illuminating comprises illuminating with light having a wavelength of 193 nm.

39. the method of claim 31 wherein said illuminating comprises illuminating with light having a wavelength of 248 nm.

40. the method of claim 31 wherein said illuminating comprises illuminating with light having a wavelength of 365 nm.

41. The method of claim 1 wherein said illuminating comprises using a programmable mask.

42. The method of claim 41 further including reprogramming said programmable mask to provide at least first and second different exposure patterns, and allowing said nanoparticles to at least partially relax after exposure with said first pattern and before exposure with said second pattern.

43. The method of claim 1 wherein said illuminating comprises using multiple fixed masks.

44. The method of claim 1 further including performing said exposing in liquid-immersion or solid-immersion.

45. the method of claim 44 wherein said illuminating comprises illuminating with light having a wavelength of 157 nm.

46. the method of claim 44 wherein said illuminating comprises illuminating with light having a wavelength of 193 nm.

47. the method of claim 44 wherein said illuminating comprises illuminating with light having a wavelength of 248 nm.

48. the method of claim 44 wherein said illuminating comprises illuminating with light having a wavelength of 365 nm.

49. The method of claim 1 wherein said coating includes spinning.

50. The method of claim 1 wherein said reversible photo bleachable material comprise plural different types of nano-particles.

51. The method of claim 1 wherein said reversible photo bleachable material comprise multiple layers containing nano-particles.

52. The method of claim 1 further including further processing said photoresist to at least in part define at least one structure on said semiconductor wafer.

53. The method of claim 1 further including reversing said bleaching of said contrast enhancement layer.

54. The method of claim 1 further including tuning the absorption edge of said nanoparticles by specifying the size of said nanoparticles.

55. The method of claim 1 wherein said illuminating comprises illuminating said layer with light having a wavelength of 365 nm or shorter.

56. The method of claim 1 wherein said illuminating comprises illuminating said layer with light having a wavelength of 193 nm.

57. The method of claim 1 wherein said illuminating comprises illuminating said layer with light having a wavelength of 248 nm.

58. The method of claim 1 wherein said illuminating comprises illuminating said layer with light having a wavelength of 157 nm.

59. The method of claim 1 further including using said nanoparticles to resolve light distribution with high spatial frequency.

60. The method of claim 1 wherein said nanoparticles comprise semiconductor nanoparticles.

61. The method of claim 1 wherein said nanoparticles include Aluminum Nitride nanoparticles.

62. The method of claim 1 wherein said nanoparticles include Aluminum Nitride alloys.

63. The method of claim 1 wherein said nanoparticles include Aluminum Nitride isomers.

64. The method of claim 1 wherein said nanoparticles have electronic structures exhibiting a band-gap.

65. The method of claim 1 wherein said collecting includes passing said light through at least one lens.

66. The method of claim 1 wherein coating includes spraying.

67. The method of claim 1 wherein coating includes dipping.

68. The method of claim 1 wherein coating includes precipitating.

69. The method of claim 1 wherein coating includes evaporation.

70. The method of claim 1 wherein coating includes rinsing.

71. The method of claim 1 wherein coating includes a thin film deposition.

72. The method of claim 1 wherein coating includes at least two of spinning, spraying, dipping, precipitating, evaporation, rinsing, and thin film deposition.

* * * * *